United States Patent
Louzir et al.

(10) Patent No.: US 7,642,980 B2
(45) Date of Patent: Jan. 5, 2010

(54) SLOT TYPE ANTENNA WITH INTEGRATED AMPLIFIERS

(75) Inventors: Ali Louzir, Rennes (FR); Dominique Lo Hine Tong, Rennes (FR); Philippe Minard, Saint Medard sur Ille (FR); Loic Marnat, Fleac (FR)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 11/881,292

(22) Filed: Jul. 26, 2007

(65) Prior Publication Data

US 2008/0150818 A1    Jun. 26, 2008

(30) Foreign Application Priority Data

Jul. 31, 2006    (FR) .................................. 06 53205

(51) Int. Cl.
   *H01Q 13/10*    (2006.01)
(52) U.S. Cl. ..................................... 343/767
(58) Field of Classification Search ............ 343/767
   See application file for complete search history.

(56) References Cited

U.S. PATENT DOCUMENTS 4,360,813 A * 11/1982 Fitzsimmons ............... 342/350

FOREIGN PATENT DOCUMENTS

| EP | 0685901 A | 12/1995 |
|---|---|---|
| WO | WO02/47205 A | 6/2002 |
| WO | WO2005/031967 | 4/2005 |

OTHER PUBLICATIONS

William R Deal et al: "Integrated-Antenna Push-Pull Power Amplifiers" IEEE Transactions on Microwave Theory and Techniques, IEEE Service Center, Piscataway, NJ, US, vol. 47, No. 8 1999 (Aug. 1999), XP011037679 ISSN: 0018-9480 *abrege; figure 2-4, 8-13* *p. 1419, alinea II—p. 1420* *pp. 1421-142, colonne 2, alinea B **. Search Report dated Mar. 20, 2007.

* cited by examiner

*Primary Examiner*—Michael C Wimer
(74) *Attorney, Agent, or Firm*—Robert D. Shedd; Jeffrey M. Navon

(57) ABSTRACT

The present invention relates to a slot type antenna with integrated amplifiers, comprising a substrate S featuring a ground plane G, a longitudinal radiation open slot antenna, a power divider connected to a feeder line, an amplifier connected to each of the outputs of the power divider, such that the amplifiers are supplied in phase opposition, the output of the amplifiers being connected to a power combination circuit directly coupled to the excitation point of the slot type antenna.

6 Claims, 7 Drawing Sheets a) Transmission and return losses - b) Phase between the input and output port

SLOT TYPE ANTENNA WITH INTEGRATED AMPLIFIERS

This application claims the benefit, under 35 U.S.C. §119 of French Patent Application 0653205, filed Jul. 31, 2006.

The invention relates to antennas with integrated amplifiers, more particularly an open slot antenna such as a Vivaldi antenna or an antenna of a similar type connected to power amplifiers integrated on the same substrate.

BACKGROUND OF THE INVENTION

Wi-Fi technology operating in accordance with the IEEE802 11a/b/g standard and operating in the 2.4 GHz and 5 GHz frequency bands today holds the best position for very high speed wireless transmissions, especially in a domestic environment.

The transmission of several video streams, particularly high definition between for example, a station or set top box (STB) and several terminals such as computer laptops, television or other devices, requires the use of a high-order modulation to attain the maximum speed allowed by the standard, namely 54 Mbps. The high-order modulations such as the 64-QAM modulation are more demanding in terms of the output power of the power amplifier than the standard modulations. Indeed, the C/N relationship (Carrier to Noise ratio) for a given quality of reception increases with the order of modulation. Moreover, the higher the order of modulation, the weaker the tolerances to nonlinearities and the more significant the back-off of the power amplifier must be. The back-off corresponds to the margin in relation to the output power of a power amplifier defined at 1 dB of compression to ensure a linear operation of the amplifier.

Finally, the OFDM modulation comprising multiple carriers used in the Wi-Fi systems, being of non-constant envelope, is particularly sensitive to the nonlinearities of the power amplifier.

Consequently, taking into account the prior art of power amplifiers, all of these constraints mean that it is currently difficult to be able to emit the maximum power permitted by the various regulations with cost and power consumption constraints compatible with the targeted products.

In particular, in the 5 GHz (5.47 GHz-5.825 GHz) high frequency band, it is permitted to emit up to 30 dBm of EIRP (Equivalent Isotropic Radiated Power) in Europe and up to 35 dBm of EIRP for the United States. When using antennas with moderate directivities of the order of 8-10 dBi and when considering a transmission loss of 2 dB, linear output powers are required, taking into account the back-off greater than 22 dBm. However, with the currently available power amplifiers, it is not possible to obtain a linear output power greater than 18 dBm. Hence, it is interesting to be able to combine two or more amplifiers offering linear output powers of the order of 18 dBm in order to attain the targeted powers.

SUMMARY OF THE INVENTION

Hence, it is proposed, as illustrated in FIG. 1, to use a configuration with two amplifiers mounted in Push-Pull configuration to obtain the targeted output power.

FIG. 1 illustrates a Vivaldi type antenna with integrated amplifiers using a Push-Pull amplifier configuration. In greater detail, on the same substrate S featuring a ground plane G, a structure is produced comprising a Vivaldi antenna type 7 connected to an amplification circuit. This antenna is connected, at an excitation point 8, to an excitation line 6, using microstrip technology via electromagnetic coupling according to the Knorr technique. Hence, the microstrip line 6 is realized on the face of the substrate opposite the face of the ground plane G. The circuit of the amplifiers in Push-Pull configuration implements two hybrid rings 2 and 5 of which the representation has been simplified. Indeed, the charging resistance that must be situated between the two 0/180° accesses of each ring is not shown in this figure. More specifically and as illustrated in FIG. 1, reference 1 refers to the input port designed to be connected to the antenna's excitation circuit. This input port 1 is connected to a first hybrid ring 2 having the function of a 0-180° power divider. Therefore, on the two outputs 3 of the hybrid ring 2, signals are obtained having identical amplitudes but in phase opposition. Each of the outputs 3 is connected by means of impedance-matching lines of identical dimensions at the nearest operating wavelength, to a power amplifier 4. The output of each power amplifier 4 is connected to the input of a second hybrid ring 5, playing the role of a power combination circuit. This hybrid ring 5 is connected to the excitation line 6 of the Vivaldi type antenna. This Push-Pull configuration, that implements two hybrid rings, leads to a significant size linked to the surface occupied by the two hybrid rings. This configuration also causes additional losses provided by the hybrid rings and certain limitations in frequency bandwidth related to the bandwidths of the hybrid rings.

The present invention proposes a new structure integrating power amplifiers with an open slot antenna, more particularly with any antenna using a line/slot transition of the Knorr type.

The present invention therefore relates to an antenna with integrated amplifiers comprising on a substrate equipped with a ground plane, a longitudinal radiation open slot antenna, a power divider connected at the input to a feeder line and connected at the output to two amplifiers such that the amplifiers are supplied in phase opposition, the output of the amplifiers being connected at the input to a power combination circuit comprising a first microstrip line, characterized in that the first microstrip line is directly coupled with the slot of the slot type antenna at its excitation point.

According to one embodiment, the coupling of the first microstrip line with the slot of the slot antenna is an electromagnetic coupling. The first microstrip line is preferably coupled with the slot of the slot antenna in its middle.

Moreover, the power divider comprises a slot coupled at the input, with the feeder line and at the output, with a second microstrip line, each extremity of the second microstrip line being connected to the input of an amplifier. In this case, the coupling between the slot and the feeder line or between the slot and the second microstrip line is preferably an electromagnetic coupling of the Knorr type. Moreover, the slot of the power divider is preferably a slot line of 3 $\lambda/4$ in length, in which $\lambda$ is the operating central frequency wavelength.

According to another characteristic of the invention, the longitudinal radiation slot antenna is a Vivaldi type antenna, a printed dipole, a radiating aperture of constant or linear profile, or any other antenna using a line/slot transition of the Knorr type.

BRIEF DESCRIPTION OF THE DRAWINGS

Other characteristics and advantages of the invention will appear upon reading the description of different embodiments, this description being realized with reference to the enclosed drawings, wherein.

DETAILED DESCRIPTION OF PREFERRED EMBODIMENTS

A first embodiment of the present invention will now be described with reference to FIGS. 2 to 4.

Figure 1:
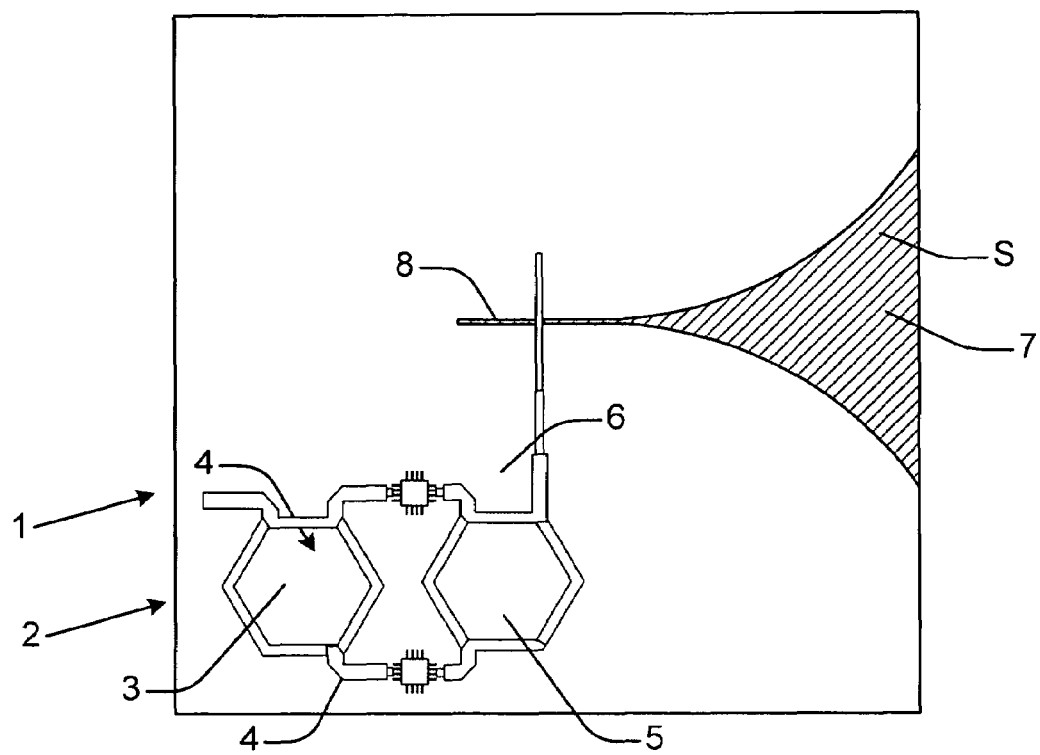
FIG. 1, already described is a diagrammatic plan view of an embodiment of a Vivaldi type antenna with integrated power amplifiers, according to the prior art.
Figure 2:
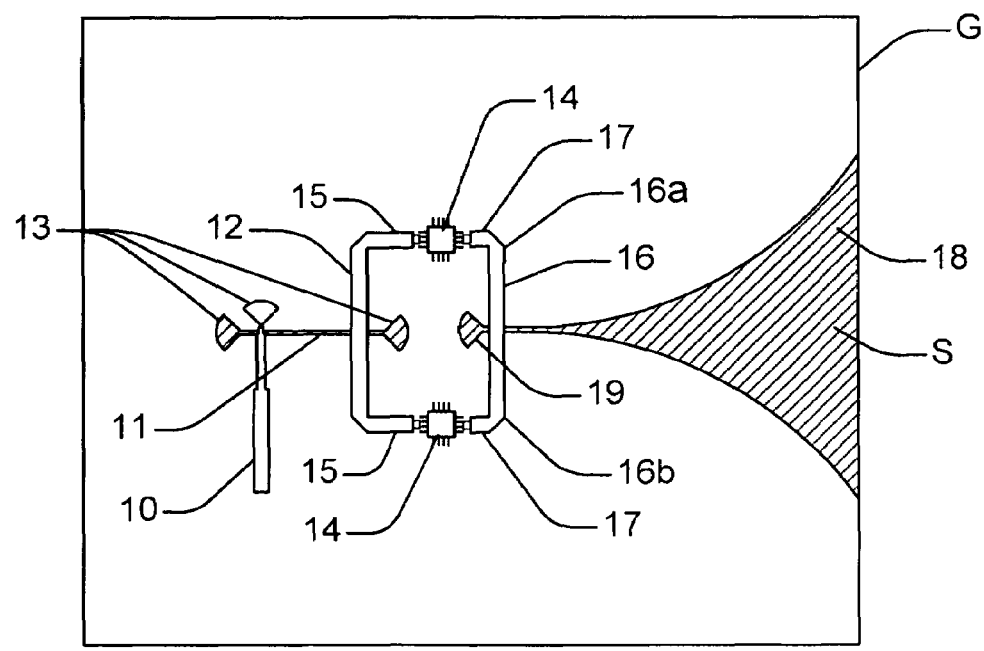
FIG. 2 is a diagrammatic plan view of a Vivaldi type antenna with integrated amplifiers, according to a first embodiment of the present invention.

Hence, as illustrated in FIG. 2, on a substrate S featuring a ground plane G, a longitudinal radiation slot type antenna was realized, more particularly in this case a Vivaldi type antenna 18. Furthermore, on the same substrate, we have integrated the power amplification circuit. In greater detail and as illustrated in FIG. 2, the power amplification circuit comprises a feeder line 10 realized using microstrip technology. This feeder line 10 is coupled electromagnetically according to a coupling of the Knorr type with a first slot line 11. The slot line 11 is coupled at the output with a first microstrip line 12. The coupling of the microstrip line 12 with the slot line 11 is realized in the middle of the microstrip line by using an electromagnetic coupling of the Knorr type. Moreover, to realize the impedance matching of the assembly, "stubs" 13 are provided at each extremity of the slot line 11 and at the end of the microstrip line 10. This assembly forms a power divider, allowing signals of the same amplitude but in phase opposition to be obtained at both extremities (P(0°) and P(180°) of line 12.

The power divider is illustrated in more detail in FIG. 3 and its functioning is explained with reference to FIG. 4 that shows in a), the transmission and return losses and in b), the phase difference depending on the frequency between the ports. Hence, it is observed that the phase difference between the two output ports P(0°) and P(180°) of the microstrip line 12 remains equal to 180° on a very wide frequency band. Indeed, since this structure is perfectly symmetric with respect to the slot, and there is no resonant element, the phase difference between the two ports is therefore constant for a very large bandwidth. This is not the case for a hybrid ring, which is dimensioned by means of elements whose length is proportional to the wavelength quarter.

It can be can noted further in FIG. 4a, the good performances in terms of transmission losses for this junction, less than 1 dB on a wide frequency band.

Figure 3:
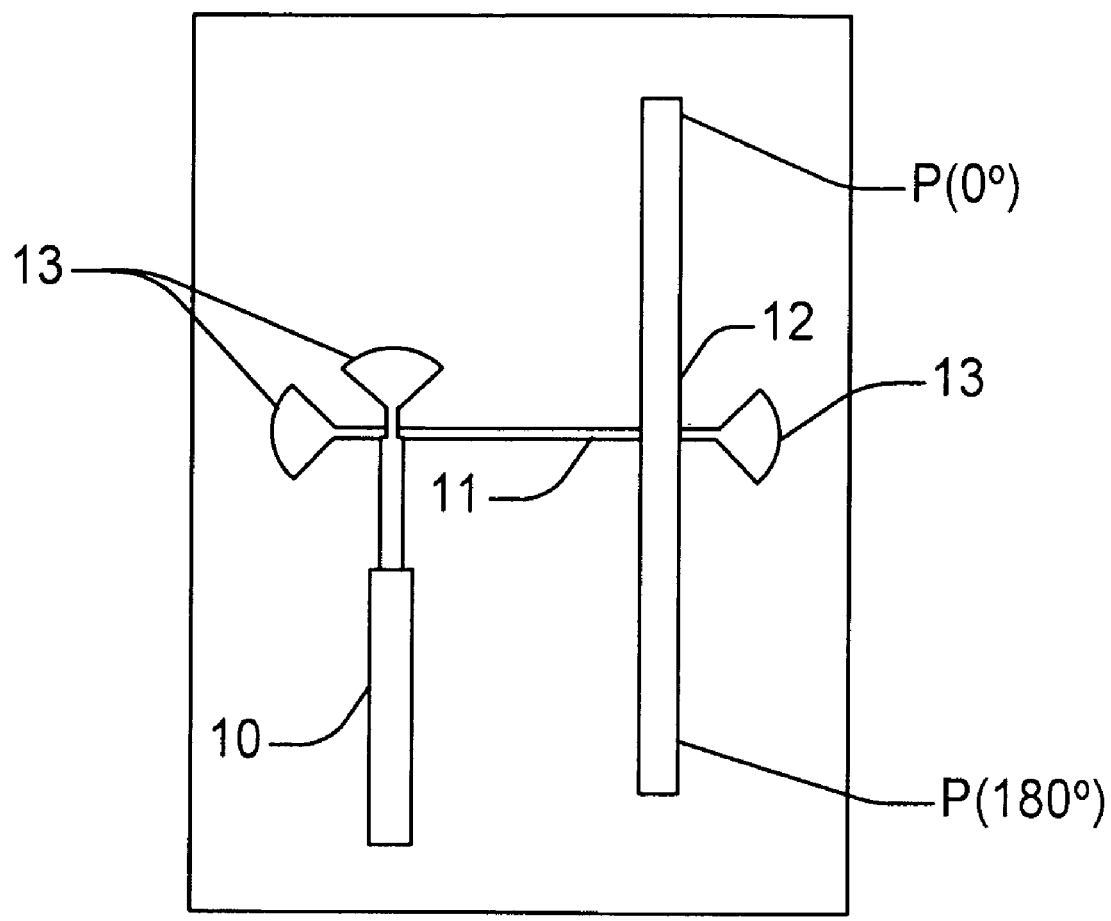
FIG. 3 is an enlarged diagrammatic plan view of the frequency divider part, used with the antenna of FIG. 1.
Figure 4:
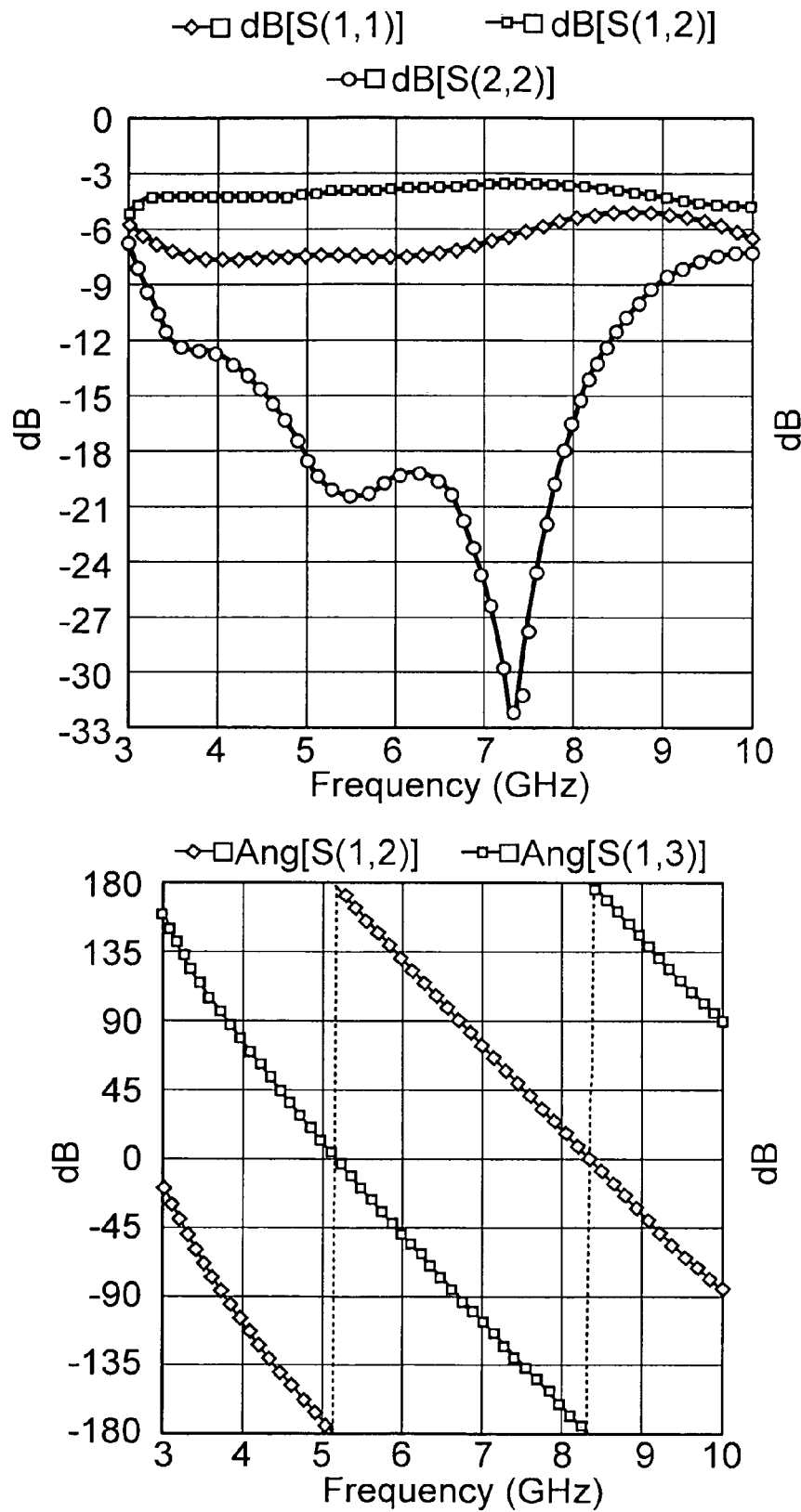
FIG. 4 illustrates in a, the transmission and return losses, and in b, the phase between the input port and each of the output ports of the frequency divider in FIG. 3.

The results shown in FIG. 4 were obtained using the electromagnetic software IE3D (Zeland), by simulating the structure of FIG. 3 realized on a substrate of the type Rogers 4003 ($\epsilon r$=3.38 mm, h=0.81 mm and =17.5 μm). For the power divider, the feeder line 10 is formed by a microstrip line of characteristic impedance 50 ohms and width 1.85 mm and an impedance matching microstrip of width 1.06 mm and length 6.65 mm. The output microstrip line 12 of the divider has a width of 1.56 mm and a length of 13.3 mm. Stubs 13 are used for the impedance matching. The radial stub at the extremity of the microstrip line 10 has a radius of 2.9 mm and an aperture of 80° and the two radial slot stubs used at each extremity of the slot line present the same dimensions. Moreover, the slot line 11 has a width of 0.4 mm and a length of 11.5 mm.

As illustrated in FIG. 2, each extremity of the output microstrip line of the divider is connected by means of impedance matching lines 15 at the input of a power amplifier 14. The amplifiers used are preferably power amplifiers operating in class B. However, other types of amplifiers can be used. The output of each amplifier 14 is linked respectively to an input of a power combination circuit described subsequently. To ensure the phase balancing between the two channels, in the embodiment shown, the sections of the microstrip line 15 and 17 provided before and after the amplifiers have strictly equal lengths.

Moreover, as illustrated in FIG. 2 and in compliance with an essential characteristic of the present invention, the combination circuit is directly coupled with the excitation point of the slot type antenna, namely with the excitation point 19 of the Vivaldi antenna 18. More specifically, the combination circuit comprises a microstrip line 16, electromagnetically coupled with the slot of the Vivaldi antenna 18, at the level of its excitation point 19. The coupling is an electromagnetic coupling of the Knorr type and it is realized in the middle of the microstrip line 16. Hence, the microstrip-slot junction constructively combines the power coming from, at the output, the two power amplifiers 14 towards the excitation slot line of the Vivaldi antenna 18. The length of the line sections 17 being strictly equal, the power arriving via the two accesses 16a and 16b of the microstrip line 16 are in phase opposition. It is this phase difference of 180° that allows a constructive combination of the power at the level of the slot.

Simulations realized for the junction alone show that, in the case of an excitation with phase opposition, the gain of the Vivaldi type antenna varies between 5 dB and 6.5 dB on the 5 GHz-0.6 GHz band and suddenly falls below −7 dB in the case of a phase excitation. Moreover, this junction, by reflecting the second order harmonic, helps to improve the efficiency of each of the power amplifiers. Indeed, the Knorr type transition for the slot "stub" is in the order of a multiple of a quarter of the wavelength. Hence, in the transition plane, the slot "stub" brings about an open circuit plane at the operating frequency, which amongst other things enables the coupling. However, at double the frequency this same "stub" brings about a short circuit in the transition plane, thus minimizing the coupling. This removes the second order harmonic.

Another embodiment of the present invention will now be described with reference to FIGS. 5 to 6.

Figure 6A:
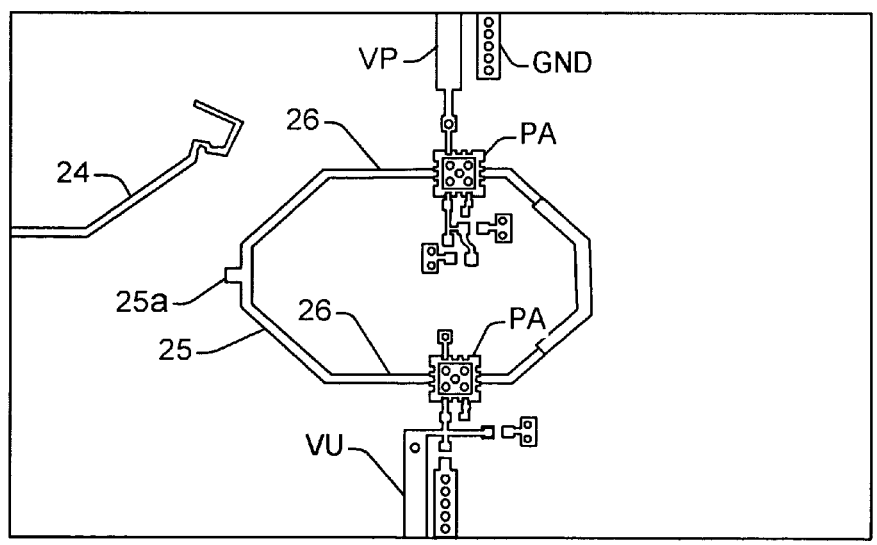
FIGS. 6A, 6B and 6C are plan views showing the different conductive layer levels for the realization of the antenna and of its related circuit on a multi-layer substrate, according to FIG. 5.

This embodiment uses a very low cost multi-layer substrate commonly known as FR4. This substrate comprises two dielectric layers and three metallization layers: an upper layer, an intermediate layer and a lower layer. The thicknesses of the two dielectric layers are respectively of 0.26 mm and 0.41 mm. The first external conductive layer or upper layer allows the microstrip lines and the supply tracks to be printed, as shown in FIG. 6A. On this upper face are also placed the components such as the amplifiers PA, chock coils L and decoupling capacitors C. Slot lines and the longitudinal radiation slot type antenna, namely a Vivaldi type antenna 20 in the illustrated embodiment, are printed on the second conductive layer or intermediate layer, more particularly illustrated in FIG. 6B. Only the supply tracks 21, 22 of the power amplifiers are printed on the third conductive layer or lower layer show in FIG. 6C. This third layer allows the two power amplifiers PA to be fed whilst avoiding crossing the RF tracks printed on the upper face. Moreover, in these figures, "thru-holes" or "holes" have been diagrammatically represented, allowing the interconnection of the tracks.

Figure 5:
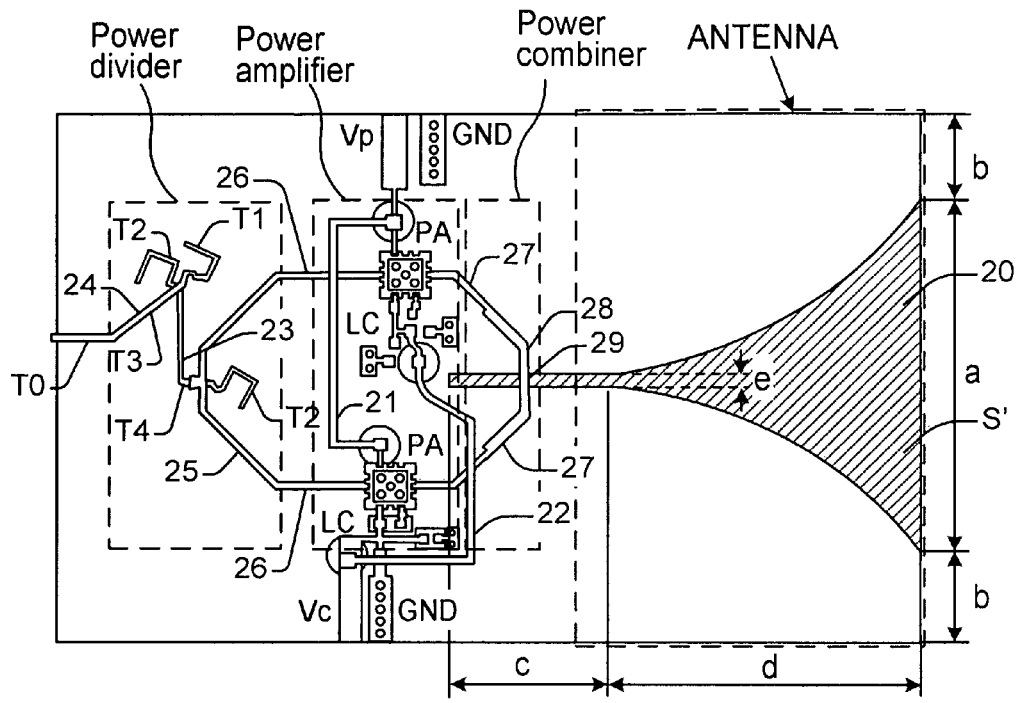
FIG. 5 is a diagrammatic top plan view of a second embodiment of a Vivaldi type antenna with integrated amplifiers in compliance with the present invention.
Figure 6B:
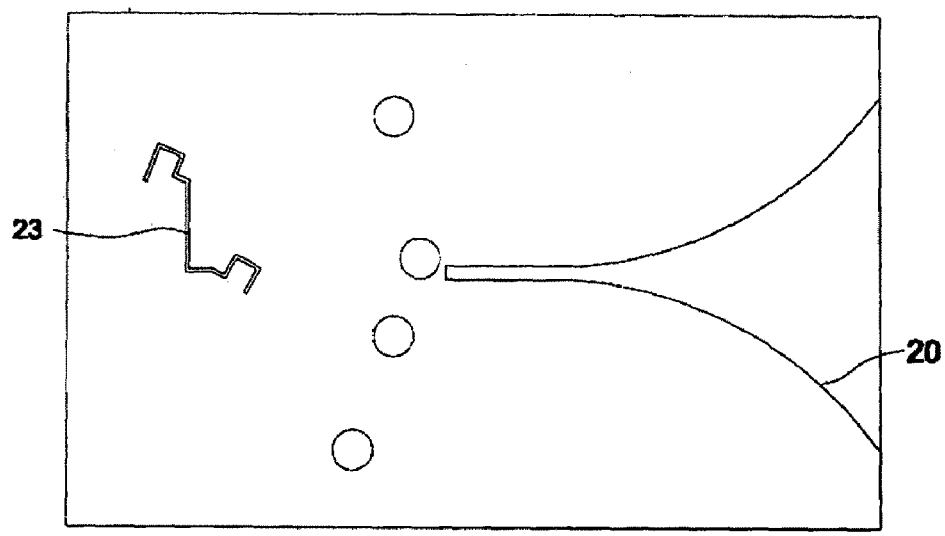
Figure 6C:
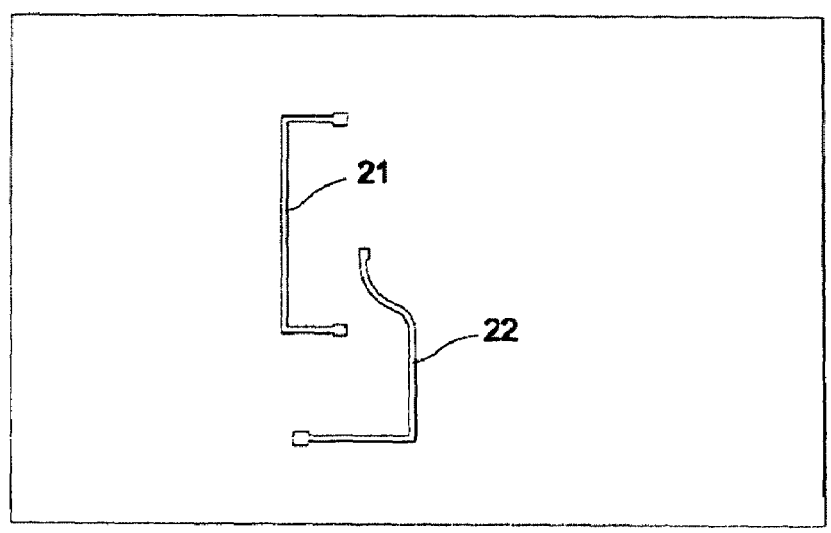

In this embodiment and as shown in FIG. 5, the power divider and the power combination circuit use the same principle as the one used in the embodiment of FIG. 2. However, the arrangement of the slot line of the power divider and of the microstrip lines has been achieved in such a manner that there is sufficient isolation between the inputs and outputs of the power amplifiers while reducing the size of the circuit.

Indeed, as illustrated in FIG. 5, the slot line 23 of the power divider is perpendicular to the radiation slot of the Vivaldi type antenna 20. This particular arrangement allows the couplings to be reduced through radiation and thus potential oscillation problems of the amplifiers to be avoided.

In more detail, the power divider in FIG. 5 comprises a feeder line 24 made up of an external part T0, formed by a characteristic impedance line of 50 ohms and width 0.48 mm, extending via a microstrip line T3 forming an impedance transformer of width 0.35 mms and length 6.3 mm and by an open circuit microstrip line T1 of width 0.25 mm and length 6.9 mm. This feeder line 24 is coupled electromagnetically, in accordance with a Knorr coupling, with the slot line 23 formed by two open circuit slot lines T2 of width 0.25 mm and length 7.2 mm, linked by a transition slot line T4 of width 0.25 mm and length 7.9 mm, perpendicular to the slot line of the Vivaldi type antenna 20. For a suitable operation, the slot line 23 has a total length preferably equal to 3λ/4, where λ is the operating frequency wavelength.

The slot line 23 is coupled at the output with a microstrip line 25, which extends via two microstrip lines 26 of characteristic impedance of 50 ohms and width 0.48 connecting each output of the power divider to a power amplifier PA. The middle of the microstrip line 25 comprises an impedance matching section 25a added to the central node of the divider to compensate for an amplitude imbalance between the outputs of the divider. Moreover, the line sections 26 have identical lengths. The output of each power amplifier PA is connected by a line section 27 to an input of a power combination circuit formed by a microstrip line 28 coupled electromagnetically in 29 with the Vivaldi type antenna 20. The output lines 27 of the amplifiers have a characteristic impedance of 50 ohms, a width of 0.48 mm and are of identical length to the nearest wavelength.

The power combination circuit is formed with a microstrip line 28 coupled electromagnetically in accordance with a Knorr type coupling at the excitation point 29 of the slot of the Vivaldi type antenna. The excitation point 29 can be found in the middle of the microstrip line 28. In this case, the microstrip line has a width of 0.84 mm and a length of 12.3 mm. The Vivaldi antenna, as shown in FIG. 5, has the following dimensions:

Opening a of the tapered slot=25.2 mm,
edges b of the Vivaldi antenna=6 mm,
length d of the tapered part=21.3 mm,
width e of the excitation slot=0.82 mm,
length c of the excitation slot=9.8 mm.

Figure 7:
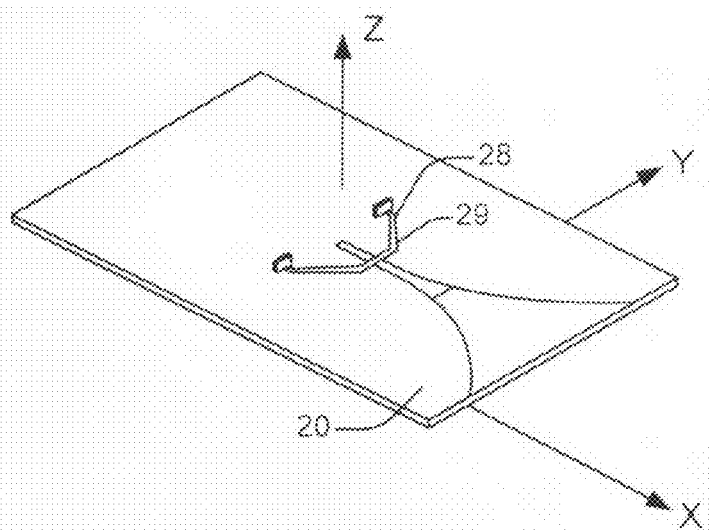
FIG. 7 is a perspective view of the antenna part such as simulated.

The antenna part as shown in FIG. 7 was simulated by a HFSS electromagnetic simulator integrating the ground plane useful for the integration of the push-pull function. The results of the simulation are shown in FIGS. 8 and 9.

Figure 8:
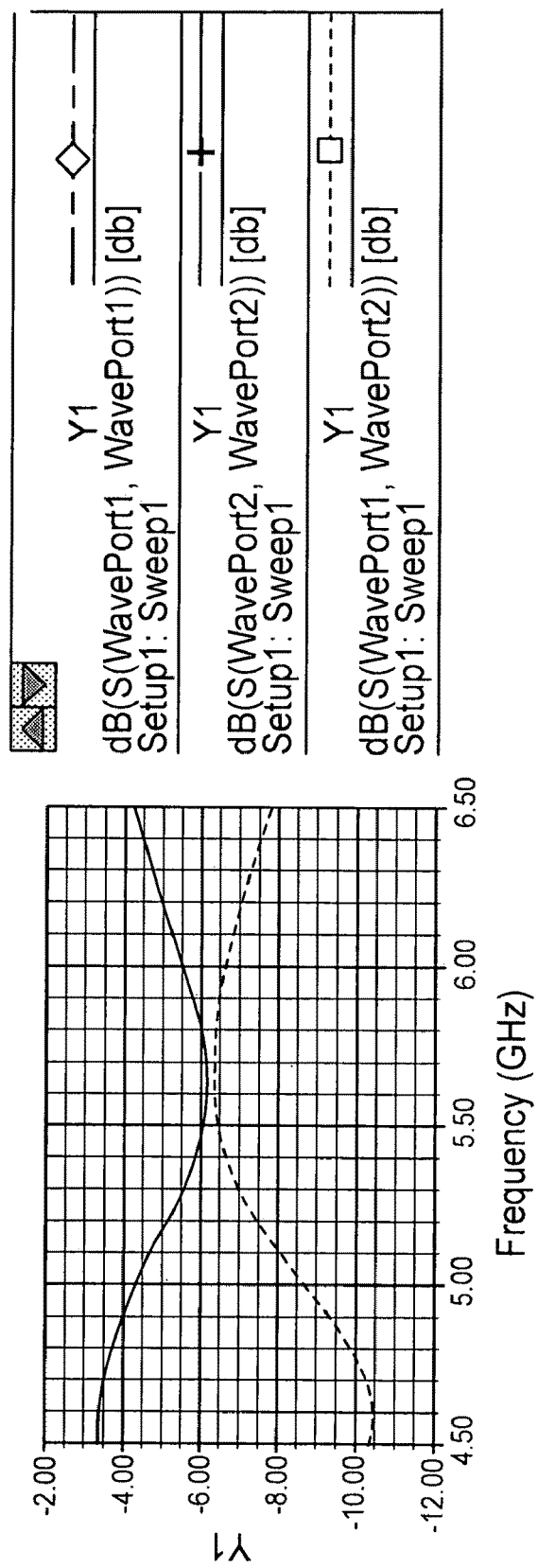
FIG. 8 shows the impedance matching and isolation curves between the two accesses to the antenna.

FIG. 8 shows the impedance matching of the two accesses and isolation between these two accesses. An impedance matching of approximately −6 dB and an isolation better than −6 Db allows a good efficiency in the event of an excitation of the two 0° and 180° accesses.

Figure 9:
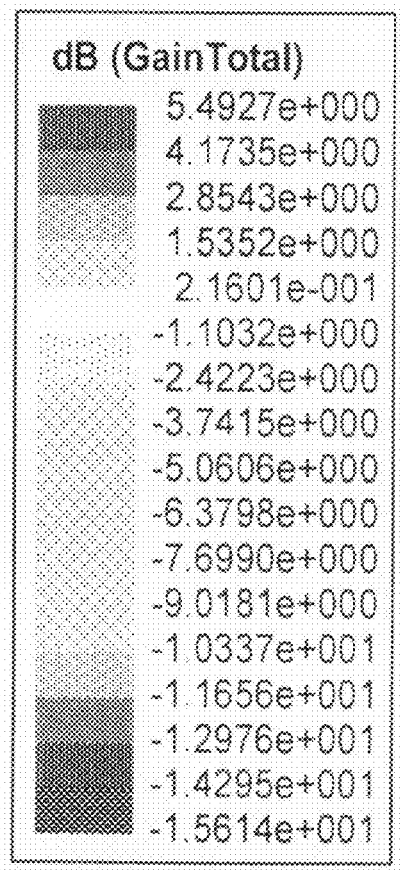
FIG. 9 illustrates the radiation pattern of the antenna with an excitation of the antenna in 0°/180°.
Figure 9:
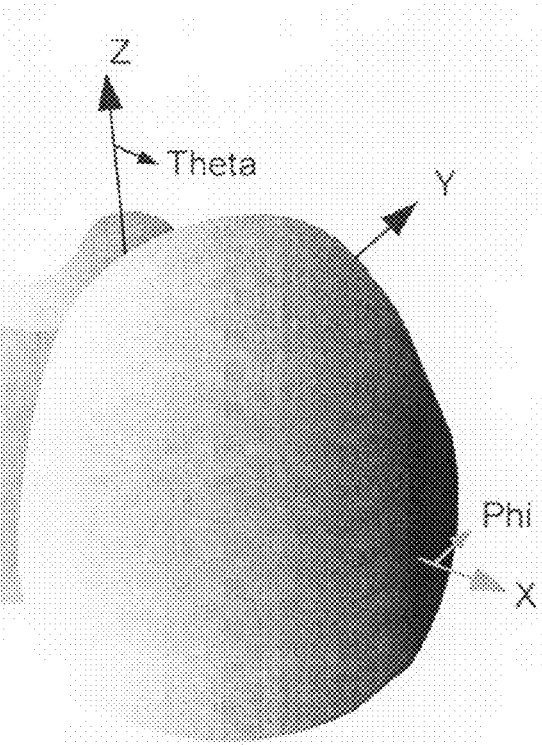

FIG. 9 shows the gain radiation pattern @5.4 GHz with an antenna excitation at 0°/180°. This antenna gives a gain greater than 5.5 dBi. It is obvious to those in the skilled art that this gain can be altered by adjusting the profile of the Vivaldi antenna.

It is obvious to those in the skilled art that the dimensions above are given as an example and to show the feasibility of the invention. They are by no means restrictive.

What is claimed is:

1. An antenna with integrated amplifiers comprising on a substrate equipped with a ground plane, a longitudinal radiation open slot antenna, a power divider comprising a slot with an input side and an output side, said slot being coupled at the input to a feeder line and at the output to a second microstrip line, each extremity of the second microstrip line being connected to the input of an amplifier, such that the two amplifiers are supplied in phase opposition, the output of the amplifiers being connected at the input to a power combination circuit comprising a first microstrip line, directly coupled with the slot of the slot type antenna at its excitation point.

2. The antenna according to claim 1, wherein the coupling of the first microstrip line with the slot of the slot antenna is an electromagnetic coupling.

3. The antenna according to claim 2, wherein the first microstrip line is coupled with the slot of the slot antenna in its middle.

4. The antenna according to claim 1, wherein the coupling between the slot of the power divider and the feeder line or between the slot of the power divider and the second microstrip time is an electromagnetic coupling of the Knorr type.

5. The antenna according to claim 1, wherein the slot of the power divider is a slot line of length 3λ/4, λ being the length of the operating frequency wavelength.

6. The antenna according to claim 1, wherein the longitudinal radiation slot antenna is a Vivaldi type antenna, a radiating aperture with a constant or linear profile, or any other antenna using a line/slot transition of the Knorr type.

* * * * *